US006707341B2

(12) United States Patent
Yamamoto et al.

(10) Patent No.: US 6,707,341 B2
(45) Date of Patent: Mar. 16, 2004

(54) SEMICONDUCTOR DEVICE WITH BIPOLAR TRANSISTOR DEVICE

(75) Inventors: Kazuya Yamamoto, Hyogo (JP); Satoshi Suzuki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/902,102

(22) Filed: Jul. 11, 2001

(65) Prior Publication Data

US 2002/0063601 A1 May 30, 2002

(30) Foreign Application Priority Data

Nov. 30, 2000 (JP) .................................... 2000-364760

(51) Int. Cl.[7] .............................................. H03F 3/04
(52) U.S. Cl. ........................ 330/289; 330/129; 330/133
(58) Field of Search ................................. 330/129, 133, 330/134, 296, 289

(56) References Cited

U.S. PATENT DOCUMENTS

| 4,038,677 A | * | 7/1977 | Nagel et al. ............... 257/529 |
| 5,321,279 A | * | 6/1994 | Khatibzadeh et al. ....... 257/197 |
| 5,432,473 A | * | 7/1995 | Mattila et al. .............. 330/133 |
| 5,629,648 A | * | 5/1997 | Pratt ........................... 330/289 |
| 6,236,266 B1 | * | 5/2001 | Choumei et al. ........... 330/133 |

FOREIGN PATENT DOCUMENTS

| JP | 9-181086 | 7/1997 |
| JP | 11-186282 | 7/1999 |

OTHER PUBLICATIONS

Yamamoto et al. "A 3.2–V Operation Single–Chip Dual–Band AlGaAs/GaAs HBT MMIC Power Amplifier With Active Feedback Circuit Technique", IEEE Journal of Solid State Circuits, vol. 35, No. 8, Aug. 2000, pp. 1109–1120.
Related U.S. patent application Ser. No. 09/443,372, filed Nov. 19, 1999.

* cited by examiner

Primary Examiner—Tuan T. Lam
(74) Attorney, Agent, or Firm—McDermott, Will & Emery

(57) ABSTRACT

A single transistor device is configured of a plurality of transistor cells divided and arranged in a plurality of blocks. Corresponding to the blocks a plurality of bias current supply circuits are arranged, respectively, to supply the blocks with individual bias currents, respectively. The bias current supply circuits each have a transistor with a bias condition set to decrease its ability to drive current as the corresponding bias current increases. Thus a negative feedback can be given to an increase in bias current attributed to thermal unevenness.

4 Claims, 16 Drawing Sheets

SEMICONDUCTOR DEVICE WITH BIPOLAR TRANSISTOR DEVICE

BACKGROUND OF THE INVENTION

1. Field of the Invention

The present invention relates generally to semiconductor devices and particularly to those including a bipolar transistor device configured of transistor cells arranged in a matrix.

2. Description of the Background Art

Power amplifiers for mobile communications currently, widely used include monolithic microwave integrated circuits (MMICs), hybrid integrated circuits (hybrid ICs), multitip modules and the like. These modules have an amplifying element in the form of a GaAs-metal semiconductor field effect transistor (GaAs-MESFET), a high electron mobility transistor (HEMT), a hetero-junction bipolar transistor (HBT) or the like.

Particularly, a hetero-junction bipolar transistor (hereinafter also simply referred to as an HBT) formed on a GaAs substrate, a Si substrate or the like is expected to serve as a future power element for mobile communications as it is more advantageous than conventional field effect transistors (FETs), as described below:

(1) operable by a single power supply as it does not require a negative gate bias voltage;

(2) capable of turning on/off without having an analogue switch on its drain side, as in a Si-metal oxide semiconductor FET (Si-MOSFET); and (3) having a high output power density, thus capable of providing a defined output if it is reduced in size as compared to FET power amplifiers.

As such features of the HBT attract attention, an HBT power amplifier is also being applied for example to a 2 W-4 W, high-output mobile telephone, such as the European Global System for Mobile Communications (European GSM), a currently most widely used, 900 MHz band mobile telephone system mainly employing a Si-MOSFET.

A power amplifier employs a transistor device generally configured of a plurality of transistor cells arranged on a semiconductor substrate in rows and columns. Hereinafter such a configuration will also be referred to as a multi transistor cell configuration.

FIG. 14 is a circuit diagram showing a configuration of a bipolar transistor device having a multi transistor cell configuration.

With reference to FIG. 14, a plurality of transistor cells Tr11–Trmn arranged in m rows and n columns in effect operate as a single bipolar transistor device TR, wherein m and n are each a natural number.

Corresponding to the rows of transistor cells, local base lines LBL1–LBLm and local collector lines LCL1–LCLm are arranged, respectively. Hereinafter, local base lines LBL1–LBLm and local collector lines LCL1–LCLm will generally be referred to as a local base line LBL and a local collector line LCL, respectively.

Each transistor cell has its base and collector regions electrically coupled with its corresponding row's local base and collector lines LBL and LCL, respectively.

Local base lines LBL1–LBLm are each electrically coupled with a common base line CBL. On common base line CBL, a bias current Ibs supplied from a bias supply circuit (not shown) is superimposed on an RF signal input to a base terminal Tb.

Local collector lines LCL1–LCLm are each electrically coupled with a common collector line CCL. Furthermore, each transistor cell has its emitter region electrically coupled with a ground voltage Vss to provide a so-called emitter-grounding.

Transistor device TR applied to a power amplifier receives a radio-frequency input (an RF signal input) at base terminal Tb coupled with common base line CBL and outputs an amplified, radio-frequency output (RF signal output) at collector terminal Tc coupled with common collector line CCL.

Corresponding to transistor cells Tr11–Trmn, base ballast resistors Rb11–Rbmn and emitter ballast resistors Re11–Remn are provided, respectively. A ballast resistor is generally used to prevent a bipolar transistor device having a multi transistor cell configuration from having an uneven collector current attributable for example to an uneven heat distribution caused by heat generation.

More specifically, each base ballast resistor and each emitter ballast resistor when their respective transistor cell operates give a negative feedback to a base current and an emitter current, respectively. Thus they act to eliminate a variation in current between transistor cells to provide a uniform current. This can prevent a specific transistor cell from intensively receiving current and thus prevent the transistor from being thermally destroyed.

FIG. 15 is a conceptual view showing a layout of a bipolar transistor device having a multi transistor cell configuration.

FIG. 15 shows a bipolar transistor device TR configured of transistor cells Tr11–Tr67 arranged in six rows and seven columns by way of example. Transistor cells Tr11–Tr67 are grouped into blocks BLK1–BLK3 each formed of two rows of transistor cells.

Corresponding to blocks BLK1–BLK3, local base lines LBL1–LBL3 are arranged, respectively. Each transistor cell has its base region electrically coupled with its corresponding local base line LBL via a base ballast resistor. In FIG. 15, the arrangement of a base ballast resistor Rb12 for transistor cell Tr12 is shown representatively.

Local base lines LBL1–LBL3 are each coupled with common base line CBL. Common base line CBL passes bias current Ibs and also receives an RF signal input.

Each transistor cell has its collector region coupled with a respective one of local collector lines LCL1a and LCL1b to LCL3a and LCL3b provided for their respective rows of transistor cells. Local collector lines LCL1a and LCL1b to LCL3a and LCL3b are each coupled with collector terminal Tc outputting an amplified RF signal.

Similarly, each transistor cell has its emitter region electrically coupled via an emitter ballast resistor (not shown) with common emitter line CEL coupled with ground voltage Vss.

FIGS. 16A and 16B are graphs each showing a distribution of a base current in a bipolar transistor device having a multi transistor cell configuration.

With reference to FIG. 16A, if the FIG. 15 bipolar transistor TR has a small base current, thermal, mutual interference between the blocks and that between the transistor cells only have a small effect and blocks BLK1–BLK3 have their respective base currents Ib1–Ib3 that are substantially uniform and thus provide a standard amount of current I1.

In contrast, as shown in FIG. 16B, if base current in total increases and thermal, mutual interference between the blocks and that between the transistor cells are no longer negligible, the operating temperature of transistor cells closer to the center of the transistor increases higher than that of peripheral transistor cells and the transistor cells with their operating temperature increased thus have an increased collector current.

In the FIG. 15 exemplary layout, base current Ib2 for block BLK2 closer to the center and thus greater in temperature elevation would have an amount of current I3 (wherein I3>>I1) larger than an amount of current I2 of base currents Ib1 and Ib3 for the other blocks (wherein I2<I1). Thus a specific block receives an intensive current.

Furthermore even within a single block a transistor cell closer to the center of the block has its operating temperature increased, resulting in a further uneven temperature profile. For example in FIG. 15 transistor cells Tr34 and Tr44 would have an operating temperature that most readily increase.

Thus, an uneven operating-temperature profile results in an uneven base current (or an uneven collector current), which in turn results in an unevenness between the blocks and further develops to a current intensively flowing in a block through a specific transistor cell, and ultimately, approximately more than 90% of the base current (collector current) flowing through the entire transistor device TR would intensively flow to the specific transistor cell.

Such a significantly intensive current results in the transistor cell having a current-amplification rate β (collector current/base current) significantly reduced due to heat generation. As such, such an intensive current, as seen in the transistor's Ic (collector current)–Vce (voltage between collector and emitter) characteristic, is observed as a phenomenon with collector current Ic rapidly decreasing as base current Ib increases even if voltage Vce is constant. Such a phenomenon is also referred to as a gain reduction attributed to an intensive current.

FIG. 17 represents an HBT device's typical Ic–Vce characteristic and load curve in its power amplification operation.

In FIG. 17 the horizontal axis represents collector-emitter voltage Vce of an HBT corresponding to a transistor cell and the vertical axis represents collector current Ic thereof. These Vce–Ic characteristics are plotted in FIG. 17 with base current Ib serving as a parameter.

With reference to FIG. 17, if collector-emitter voltage Vce is increased while a constant base current is applied, collector loss increases and collector current Ic rapidly decreases in a region. Hereinafter such a region with a rapid reduction in collector current Ic will also be referred to as a "collapse region."

If collector-emitter voltage Vce has a constant level, such a collapse region expands as base current Ib increases.

A load curve CV1 represents a load curve provided at a matched load resistance (50 Ω), or when a standard bias is applied, and the load curve has a highly resistive, efficient locus with a bias point Al serving as its center. Thus, power amplification operation can be performed as desired.

In typical mobile telephone systems including Japanese mobile telephone systems a variation in output impedance of an antenna element is not linked directly to a variation in load of a power amplifier and an isolator is thus employed therebetween. In contrast, the GSM application as described above is significantly oriented to miniaturization and reduction in output loss. Accordingly it is not provided with an isolator. As such, depending on a load condition of the antenna, the power amplifier with an HBT applied thereto would have a significantly varying load impedance.

A load curve CV2 represents a load curve provided when a power amplifier has a significantly varying load impedance, as described above. In this case, a significant reflection occurs and the load curve would expand significantly.

If in this case a transistor cell has a base current increased by an uneven operating temperature, the transistor cell would have a reduced margin for load impedance variation that is applied to avoid operation in the collapse region. In other words, for a given load impedance variation a transistor cell having a base current increased by an intensive current would more readily operate in the collapse region.

FIGS. 18A–18C represent an amplification operation of a typical power amplifier in a mobile telephone.

FIG. 18A represents a waveform of a signal input to a power amplifier employed in a mobile telephone. The signal input is a voltage signal in a pulse having an amplitude Vp.

FIG. 18B represents a waveform of an output provided when the power amplifier operates in a standard load condition as represented by the FIG. 17 load curve CV1. In this condition, the power amplifier exhibits a normal amplification characteristic and a pulsed, output signal has a constant power amplification.

FIG. 18C represents a waveform of an output provided when a transistor in the power amplifier operates in a collapse region, as shown in FIG. 17 by load curve CV2. In such a case, while a pulsed signal is amplified a single pulse would have therein a reduction in output power. As such, a pulsed signal input is inaccurately amplified and a single pulse would have therein a variation in output power. This may prevent normal communication.

Thus if a specific transistor cell receives an intensive current attributed to thermal unevenness the entire transistor device might have an impaired amplification characteristic. Furthermore, if such an intensive current is further intensified, not only is an amplification characteristic impaired but the transistor device may be destroyed.

Such disadvantages attributable to intensive current are common among bipolar transistor devices having multi transistor configuration. A GaAs substrate, on which an HBT is formed, has a high thermal resistance and once heat is generated it is hardly released therefrom, readily resulting in a thermally uneven profile across transistor cells. Thus, power amplifiers employing an HBT would more significantly suffer such disadvantages as described above.

Intensive current attributable to thermal unevenness can be prevented to some extent by providing a ballast resistor previously described. If ballast resistors are uniformly provided, however, they hardly effectively reduce an intensive current flowing to a specific block before a specific transistor cell receives an intensive current.

Transistor cells arranged in rows and columns can have a more uniform thermal distribution thereacross if a smaller number of transistor cells are arranged closer to the center of the transistor device and a larger number of transistor cells are arranged closer to the periphery thereof to alleviate heat generation and thermal effect at the center thereof or if ballast resistors closer to the center thereof, which generates heat intensively, are adapted to have a large value of resistance and those closer to the periphery thereof, which is free from significant temperature elevation, are adapted to have a small value of resistance.

Such adjustments, however, require a long period of time to optimize the number of transistor cells and the values in resistance of ballast resistors and they would in effect be hard to achieve.

SUMMARY OF THE INVENTION

The present invention contemplates providing a semiconductor device including a bipolar transistor device having a so-called multitransistor configuration with a circuit configuration capable of preventing a specific transistor cell from receiving an intensive current, to enable the transistor device to provide a reliable amplification operation and also to reduce the possibility of the device being destroyed.

Briefly speaking, the semiconductor device includes a plurality of transistor cells, a plurality of first lines, a plurality of second lines, a reference voltage line and a plurality of bias current supply circuits. The plurality of transistor cells are divided and thus arranged in a plurality of blocks to form the bipolar transistor device. The plurality of first lines are provided for the plurality of blocks, respectively, and each electrically coupled with the base region of each transistor cell of the corresponding block. The plurality of second lines are provided for the plurality of blocks, respectively, and each electrically coupled with one of the collector and emitter regions of each transistor cell of the corresponding block. The reference voltage line is electrically coupled with the other of the collector and emitter regions of each of the plurality of transistor cells. The plurality of bias current supply circuits are provided for the plurality of blocks, respectively, and each supplies a bias current to a corresponding one of the plurality of first lines. If the bias current increases, each bias current supply circuit reduces an amount of bias current to be supplied.

Thus a main advantage of the present invention is that by supplying a bias current via a bias current supply circuit arranged individually for each block and capable of giving a negative feedback to an increase in bias current, a bias current for a block receiving an intensive current attributed to thermal unevenness can be controlled to prevent a specific block from receiving an intensive current before a specific transistor cell receives an intensive current. Thus the transistor device can have a steady amplification characteristic and also be free from destruction.

In the present invention in another aspect the semiconductor device includes a plurality of transistor cells, a plurality of first lines, a plurality of second lines, a reference voltage line and a plurality of feedback circuits. The plurality of transistor cells are divided and thus arranged in a plurality of blocks to form the bipolar transistor device. The plurality of first lines are provided for the plurality of blocks, respectively, and each electrically coupled with the base region of each transistor cell of the corresponding block. The plurality of second lines are provided for the plurality of blocks, respectively, and each electrically coupled with one of the collector and emitter regions of each transistor cell of the corresponding block. The reference voltage line is electrically coupled with the other of the collector and emitter regions of each of the plurality of transistor cells. The plurality of feedback circuits are provided for the plurality of blocks, respectively, and each electrically coupling a corresponding one of the plurality of second lines and a predetermined internal node together if the corresponding second line and the internal node have therebetween a voltage difference exceeding a predetermined level of voltage.

Thus, the feedback circuits each arranged for a block of multiple transistor cells can maintain a predetermined level of voltage or less of one of collector and emitter regions that is not coupled with the reference voltage line. As such, each transistor cell can be operated avoiding a region having a gain significantly reduced. Thus, each transistor cell can be free of operation under a severe condition attributable for example to intensive current and the transistor device can thus have a steady amplification characteristic and also be free from destruction.

In the present invention in still another aspect a semiconductor device provided on a semiconductor chip includes a plurality of bipolar transistor devices amplifying a signal in phases. The plurality of bipolar transistor devices are arranged on the semiconductor chip, a bipolar transistor device of a stage preceding another stage arranged at a location experiencing a greater temperature elevation than another location.

As such, of the plurality of transistor devices amplifying a signal in phase, transistor devices of subsequent stages, accommodating higher levels of power and thus readily generating heat, can be successively arranged at locations experiencing lower levels of temperature elevation. As such, if temperature elevation causes intensive current, a transistor device accommodating a high level of power can receive reduced power. This allows each transistor device to provide reliable amplification and can also reduce the possibility of the device being destroyed.

In the present invention in still another aspect a semiconductor device provided on a semiconductor chip includes a plurality of transistor cells, a plurality of first lines, a plurality of second lines, a reference voltage line, a bias current supply circuit, and a plurality of ballast resistors. The plurality of transistor cells are divided and thus arranged in a plurality of blocks to form the bipolar transistor device. The plurality of first lines are provided for the plurality of blocks, respectively, and each electrically coupled with the base region of each transistor cell of the corresponding block. The plurality of second lines are provided for the plurality of blocks, respectively, and each electrically coupled with one of the collector and emitter regions of each transistor cell of the corresponding block. The reference voltage line is electrically coupled with the other of the collector and emitter regions of each of the plurality of transistor cells. The bias supply circuit is shared by the plurality of blocks and supplies each first line with a bias current. The plurality of ballast resistors are provided for the plurality of blocks, respectively, and each electrically coupled between the bias supply circuit and a corresponding one of the plurality of first lines. The plurality of ballast resistors are arranged on the semiconductor chip at a location experiencing a greater temperature elevation than a location having the plurality of transistor cells arranged therein.

For each block of multiple transistor cells configuring the transistor device a ballast resistor can be arranged on the semiconductor chip at a location experiencing a high temperature elevation, to give a negative feedback to an increase of a bias current for a specific block. This can efficiently reduce an intensive current flowing to a specific transistor cell that is attributed to thermal unevenness and the transistor device can thus have a steady amplification characteristic and also be free from destruction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the embodiments of the present invention will be described in detail with reference to the drawings.

First Embodiment

Figure 1:
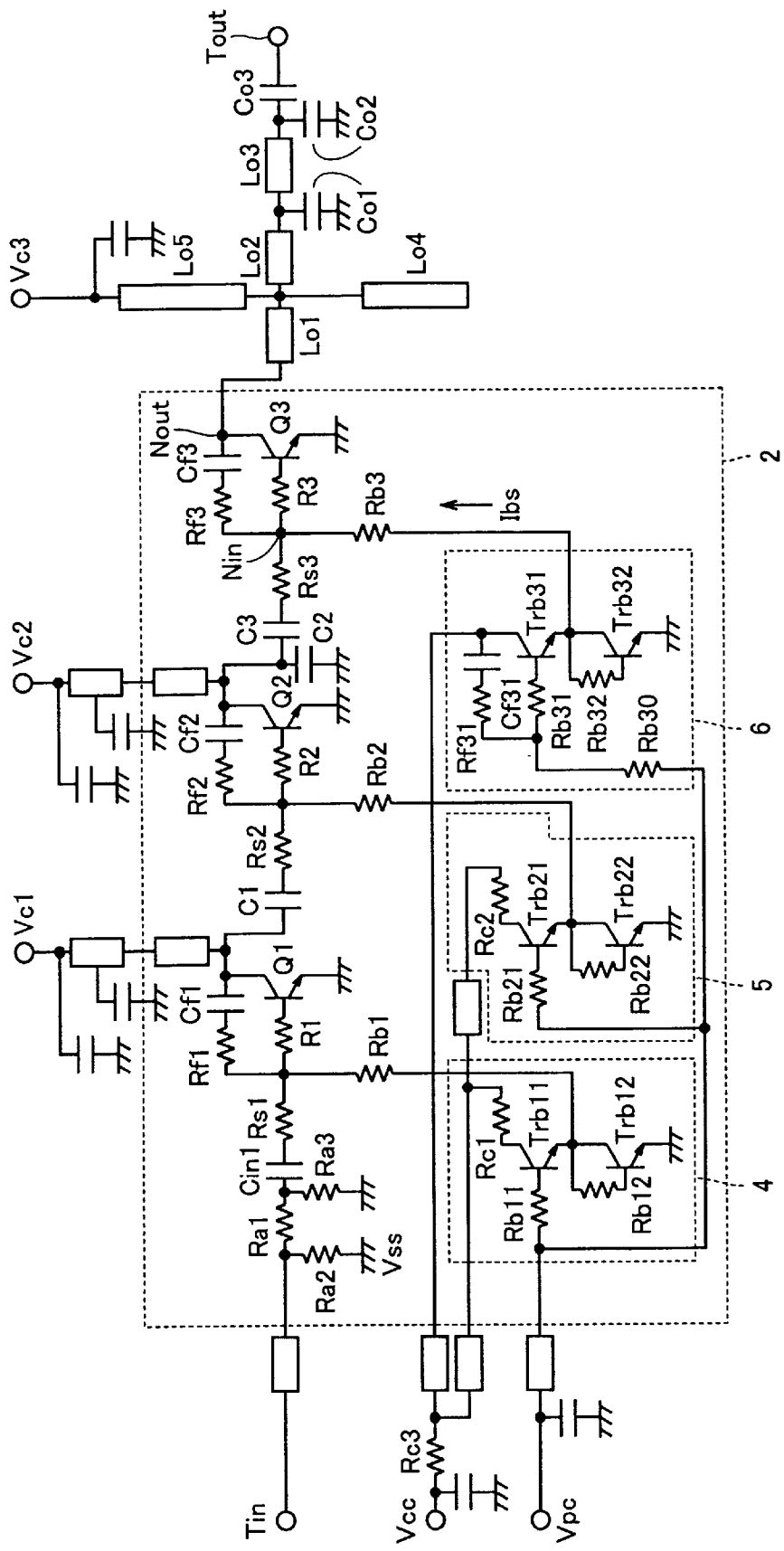
FIG. 1 is a circuit diagram showing a typical configuration of an GSM power amplifier.

FIG. 1 shows a configuration of a typical GSM power amplifier 1 exemplarily representing a semiconductor device including a bipolar transistor device of an embodiment of the present invention.

As shown in FIG. 1, power amplifier 1 is provided on a GaAs substrate 2. Power amplifier 1 has an input terminal Tin receiving a signal input, bipolar transistor devices (hereinafter also simply referred to as transistors) Q1, Q2 and Q3 provided to amplify power, and an output terminal Tout outputting an amplified signal. For the GSM application, these bipolar transistor devices are HBTs, although note that the present invention is directed to a configuration of a bipolar transistor device having a multi transistor cell configuration and its application is not limited to HBTs.

While FIG. 1 shows that an HBT can be provided on a GaAs substrate by way of example, it may be provided on a substrate formed of a material other than GaAs.

With reference to FIG. 1, three amplifying transistor devices Q1–Q3 are used to provide a 3-phased amplification operation. Corresponding to transistors Q1, Q2 and Q3, bias circuits 4, 5 and 6 are provided, respectively. A voltage Vcc is supplied as a power supply voltage for the bias circuits. In response to the level of a control voltage Vpc applied, bias circuits 4, 5 and 6 control an amount of a bias current supplied to transistors Q1, Q2 and Q3 at their base regions. Bias circuits 4, 5 and 6 feed a bias current to transistors Q1, Q2 and Q3 via base bias resistors Rb1, Rb2 and Rb3.

In FIG. 1, transistor Q3, the transistor in the final stage, receives a bias current particularly labeled Ibs. Bias current Ibs is supplied to an input node Nin, which also receives an RF input corresponding to a radio-frequency signal amplified by transistor Q2, the transistor of the immediately preceding stage.

Voltages Vc1, Vc2 and Vc3 correspond to collector bias voltages of transistors Q1, Q2 and Q3. Transistors Q1, Q2 and Q3 each provide amplification via an RC feedback circuit, since an HBT power amplifier has a high low-frequency gain and provides low-frequency oscillation more readily than an FET power amplifier. In FIG. 1, sets of (Rf1, Cf1), (Rf2, Cf2), (Rf3, Cf3) each configure an RC feedback circuit for the transistor of a stage.

Furthermore, reference characters Cin 1, C1, C2, C3 denote capacitors and Ra1–Ra3, Rs1, Rb11–Rb32, Rs1–Rs3, R1–R3, Rc3 denote resistors. Between an output node Nout corresponding to a collector terminal of the final-stage transistor Q3 and output terminal Tout there are arranged microwave lines Lo1–Lo5 and capacitors Co1–Co3.

The FIG. 1 transistors Q1–Q3 are each arranged on GaAs substrate 2 in a multi transistor cell configuration. Each transistor can be similarly configured and hereinafter the last-stage transistor Q3 configuration will be representatively described.

Figure 2:
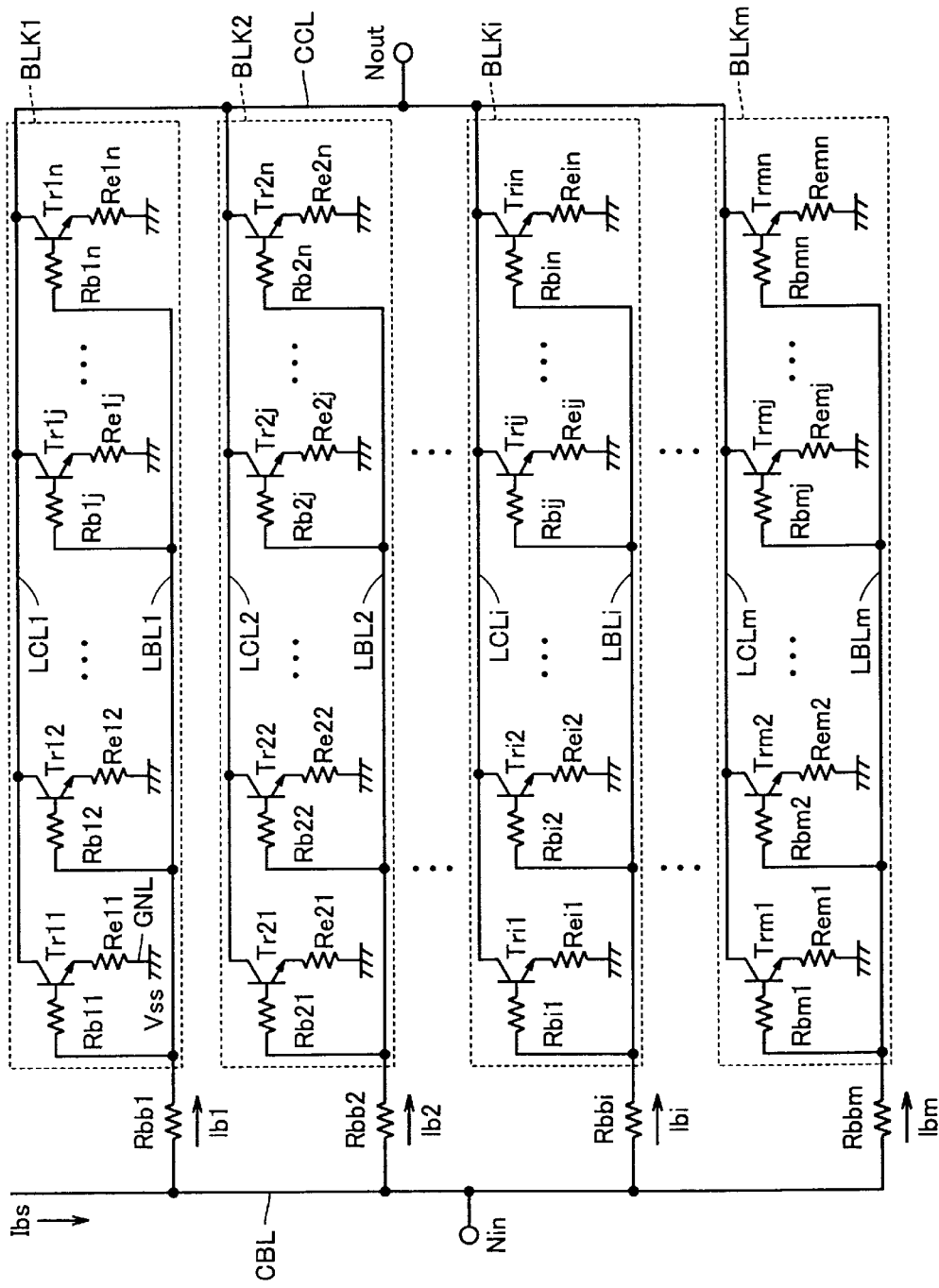
FIG. 2 is a circuit diagram showing a configuration of a bipolar transistor device in a first embodiment of the present invention.

With reference to FIG. 2, transistor Q3, a bipolar transistor of the first embodiment, is formed of transistor cells Tr11–Trmn arranged in m rows and n columns. The transistor cells belonging to a single row form a single block. Transistor cells Tr11–Trmn are divided and thus arranged in blocks BLK1–BLKm.

Corresponding to blocks BLK1–BLKm, local base lines LBL1–LBLm and local collector lines LCL1–LCLm are arranged, respectively. Each transistor cell has its base and collector regions electrically coupled with local base and collector lines LBL and LCL, respectively, of its respective block.

Each local base line LBL is electrically coupled with a common base line CBL receiving a bias current Ibs from bias circuit 6 and an RF input transmitted from transistor Q2 to input node Nin.

Local collector lines LCL1–LCLm are each coupled with a common collector line CCL coupled with an output node Nout. Each transistor cell has its emitter region electrically coupled with a ground line GNL (a ground voltage Vss) to provide emitter-grounding.

Figure 14:
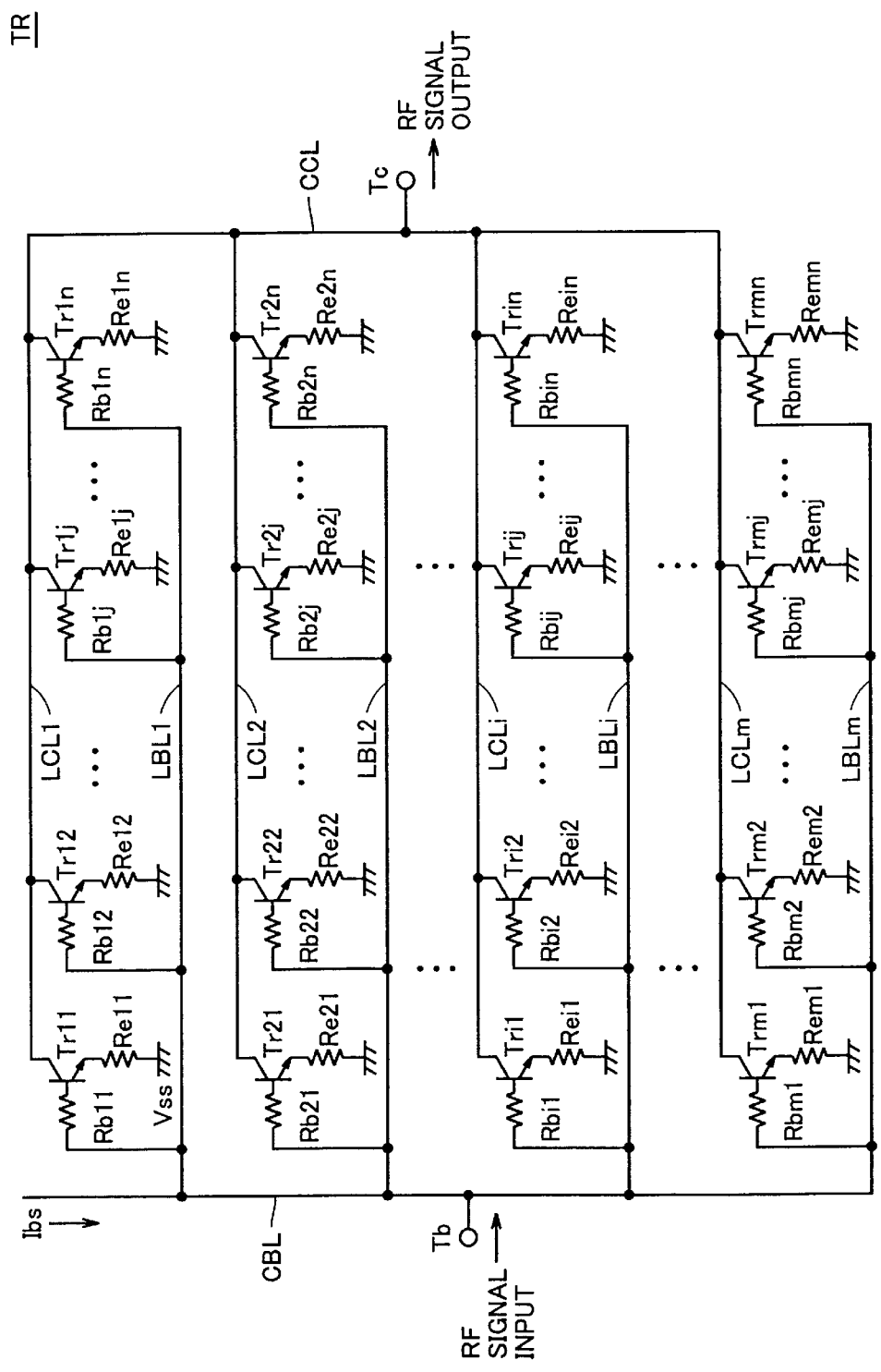
FIG. 14 is a circuit diagram showing a configuration of a bipolar transistor device having a multi transistor cell configuration.
Figure 15:
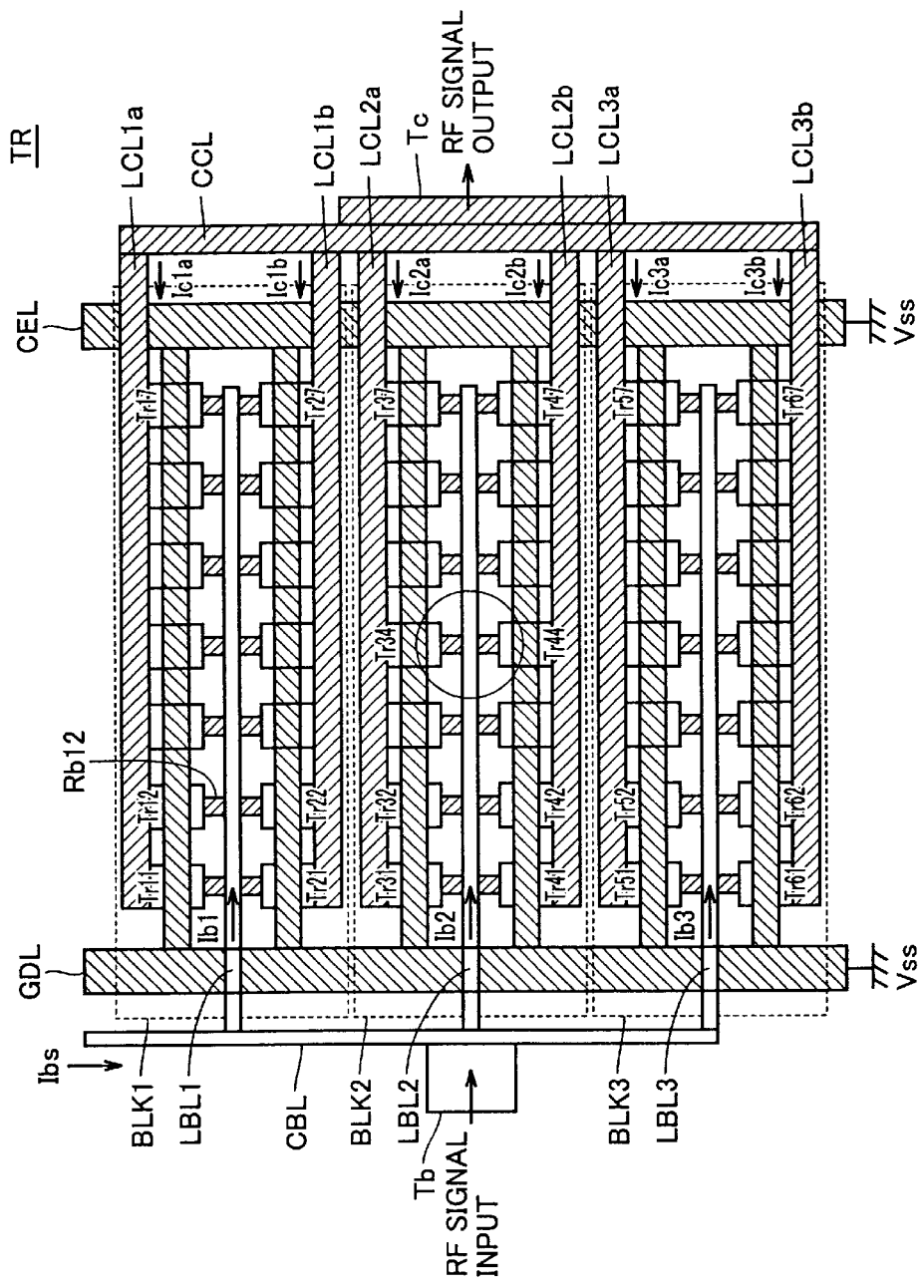
FIG. 15 is a conceptual view showing a layout of a bipolar transistor device having a multi transistor cell configuration.
Figure 16A:
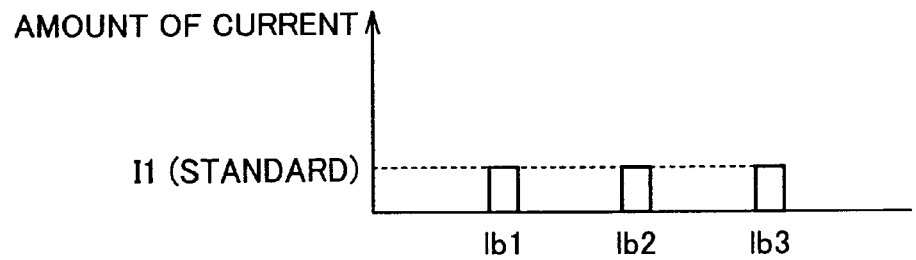
FIGS. 16A and 16B are each a graph representing a profile in base current of the bipolar transistor device having the multi transistor cell configuration as shown in FIG. 15.
Figure 16B:
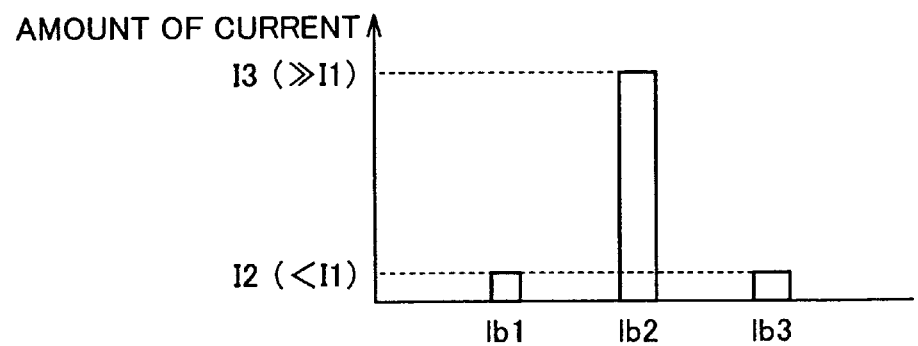

Similarly as described with reference to FIG. 14, for each transistor cell a base ballast resistor and an emitter ballast resistor are arranged. For example, for transistor cell Tr11 a base ballast resistor Rb11 and an emitter ballast resistor Re11 are arranged. Furthermore, corresponding to blocks BLK1–BLKm, ballast resistors Rbb1–Rbbm are provided, respectively, each electrically coupled between common base line CBL and a respective one of local base lines LBL1–LBLm.

Since each block is further provided with a respective one of ballast resistors Rbb1–Rbbm, a negative feedback can be given to a variation between base currents Ib1–Ibm for their respective blocks to provide a uniform current. As has been described above, in a multitransistor configuration a specific block initially receives an intensive current and in the specific block receiving the intensive current a specific transistor cell subsequently receives an intensive current. In the present embodiment, before a specific transistor cell receives an intensive current a negative feedback can be given to a variation in base current between blocks to reduce an intensive current flowing to the specific block, to effectively prevent the specific transistor cell from receiving an intensive current.

This can stabilize an amplification characteristic of the transistor device and prevent destruction of the device.

Figure 3:
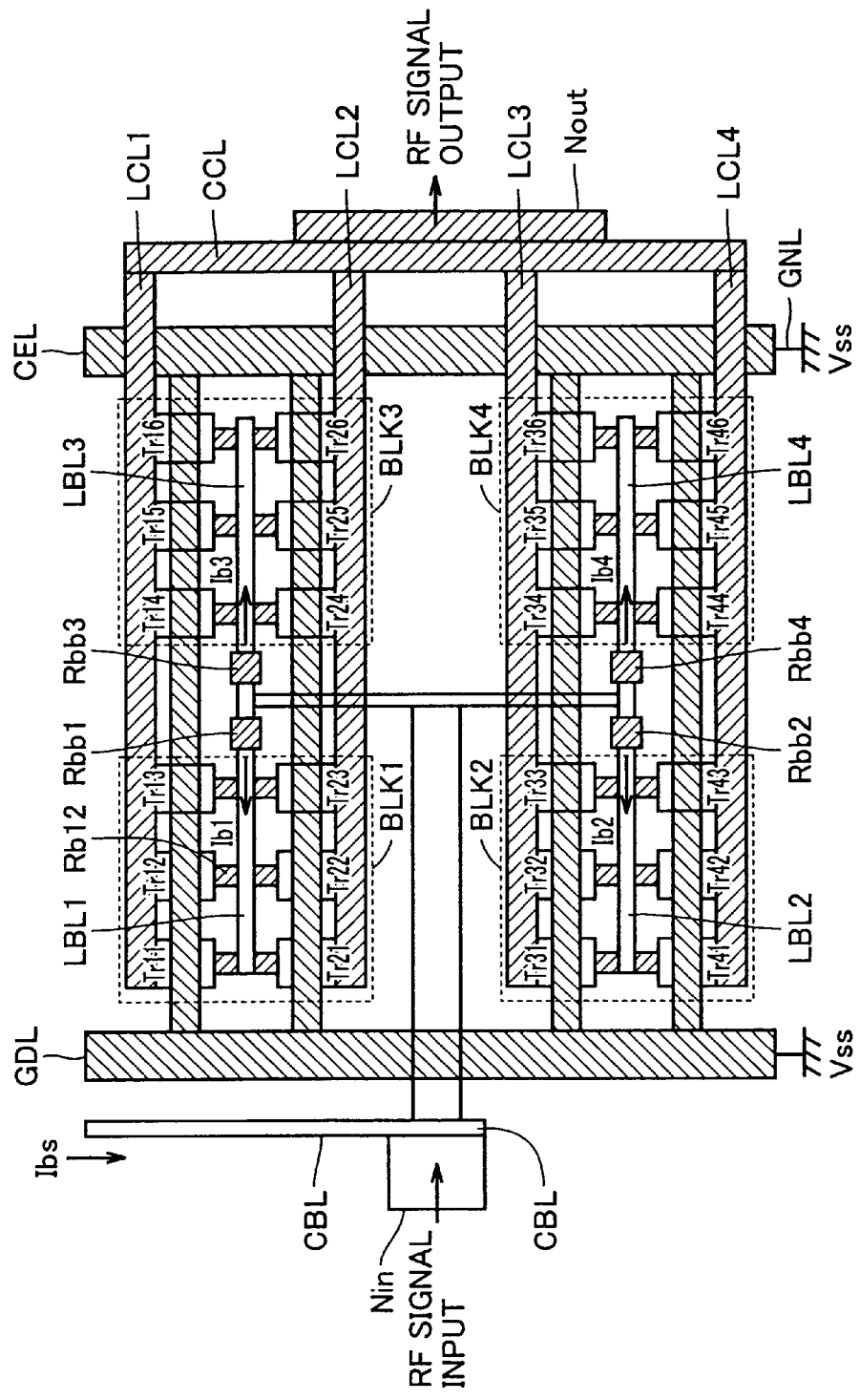
FIG. 3 is a conceptual view showing by way of example a layout of a bipolar transistor device of the first embodiment.

FIG. 3 shows an exemplary layout of a bipolar transistor device of the first embodiment.

As shown in FIG. 3, a bipolar transistor device is shown, exemplarily configured of transistor cells Tr11–Tr46 arranged in four rows and six columns.

The transistor cells arranged avoiding the center of the device, a portion experiencing a most significant temperature elevation. At the center of the device are arranged ballast resistors Rbb1–Rbb4.

Transistor cells Tr11–Tr46 are divided into four blocks BLK1–BLK4 each including a predetermined number of rows (in FIG. 3, two rows) of transistor cells divided by the center region having the ballast resistors.

Corresponding to blocks BLK1–BLK4, local base lines LBL1–LBL4 are arranged, respectively. Each transistor cell has its base region electrically coupled with a respective local base line LBL via a base ballast resistor. In FIG. 3, an arrangement of a base ballast resistor Rb12 for transistor cell Tr12 is representatively shown.

Local base lines LBL1–LBL4 are coupled with a common base line CBL via ballast resistors Rbb1–Rbb4 provided corresponding to blocks BLK1–BLK4, respectively. Common base line CBL receives bias current Ibs and an RF signal input.

Each transistor cell has its collector region coupled with a corresponding one of local collector lines LCL1–LCL4 respectively provided for the rows of transistor cells. Local collector lines LCL1–LCL4 are each coupled with output node Nout corresponding to a collector terminal of the bipolar transistor device that outputs an amplified RF signal output.

Each transistor cell has its emitter region electrically coupled via an emitter ballast resistor (not shown) with a common emitter line CEL coupled with a ground line GNL.

Ballast resistors Rbb1–Rbb4 can reduce unevenness of base currents Ib1–Ib4 flowing through local base lines LBL1–LBL4, respectively, to prevent a specific block from receiving an intensive current. Thus a specific transistor cell can be prevented in advance from receiving an intensive current.

Ballast resistors Rbb1–Rbb4, respectively provided for blocks BLK1–BLK4 divided in rows and columns, are arranged in the regions between the blocks adjacent in the direction of the rows, i.e., the region between blocks BLK1 and BLK3 and that between blocks BLK2 and BLK4. These regions are located closer to the center of the device and thus experience a temperature elevation greater than the regions having the transistor cells arranged therein.

It should be noted that as a variation of the FIG. 3 configuration, ballast resistors Rbb1–Rbb4 can be arranged in the regions between the blocks adjacent in the direction of the columns, i.e., the region between blocks BLK1 and BLK2 and that between blocks BLK3 and BLK4.

Thus transistor cells are arranged in regions other than the center region experiencing a most significant temperature elevation. This can further effectively prevent a specific transistor cell from receiving an intensive current. Thus, the transistor device can have a further stable amplification characteristic and it can also further be free from destruction.

Second Embodiment

Figure 4:
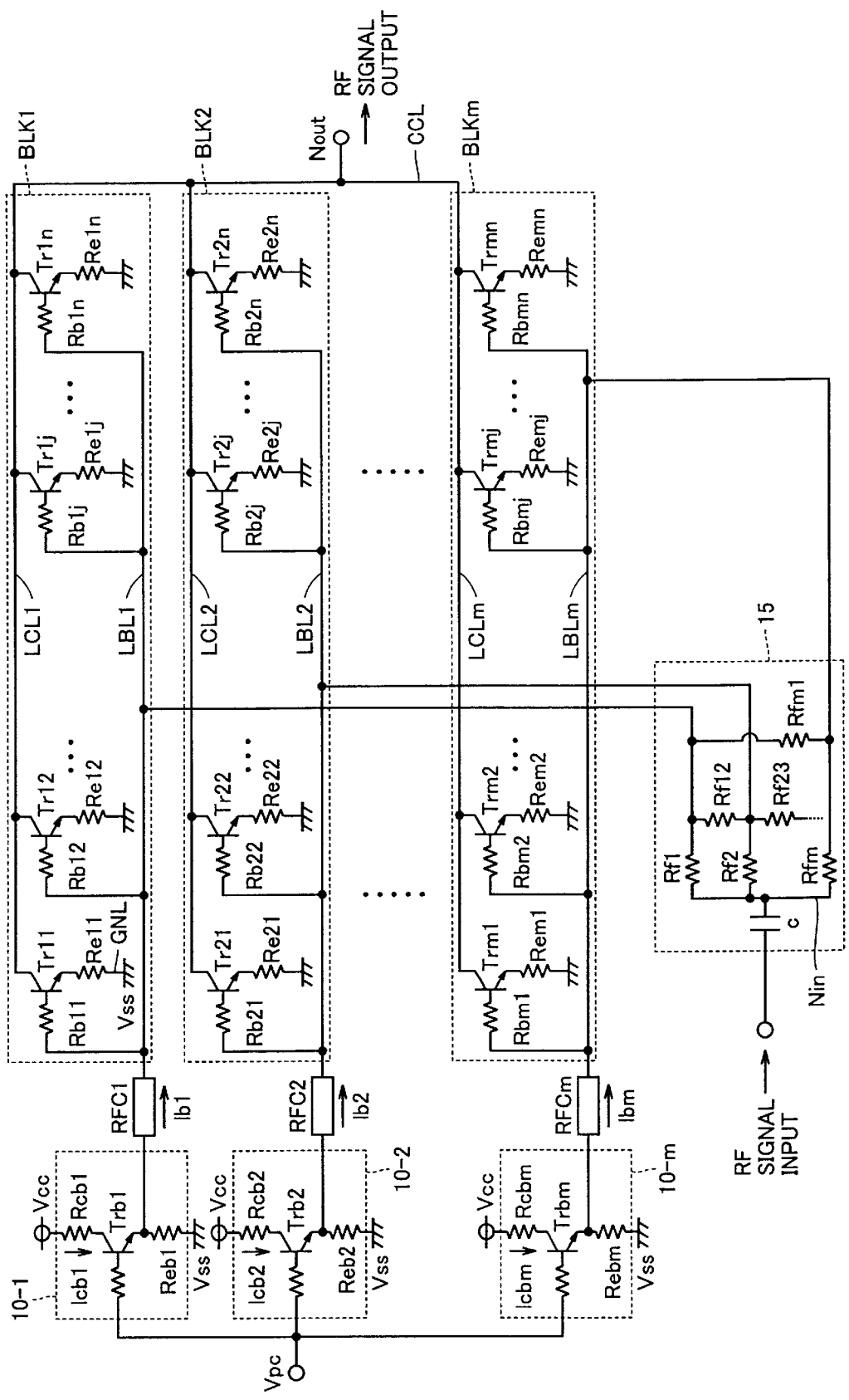
FIG. 4 is a circuit diagram showing a configuration of a bipolar transistor in a second embodiment of the present invention.

FIG. 4 shows a configuration of a bipolar transistor device in a second embodiment of the present invention.

As shown in FIG. 4, a plurality of transistor cells Tr11–Trmn arranged in m rows and n columns are divided into blocks each corresponding to a row of transistor cells. Thus, transistor cells Tr11–Trmn are divided and thus arranged in blocks BLK1–BLKm. For each block, a local base line LBL and a local collector line LCL are arranged.

In the second embodiment, common bias circuit 6 shown in FIG. 1 is replaced by individual bias current supply circuits 10-1 to 10-m for blocks BLK1–BLKm, respectively. Between bias current supply circuits 10-1 to 10-m and local base lines LBL1–LBLm there exist high impedance transmission lines RFC1–RFCm arranged to separate the base regions of the transistor cells of each block and the bias supply circuits from each other in terms of radio frequency. The high impedance transmission line can be a radio frequency inductance element.

Bias current supply circuits 10-1 to 10-m supply bias currents Ib1–Ibm which are in turn fed on local base lines LBL1–LBLm. An RF input is in turn transmitted via a filter circuit 15 onto each of local base lines LBL1–LBLm.

Filter circuit 15 includes a capacitor C passing the RF input, resistors Rf1–Rfm each coupled in series between input node Nin and a respective one of local base lines Rf1–Rfm, and resistors Rf12, Rf23, . . . , Rfm1 coupled between each coupled between two of local base lines Rf1–Rfn. Filter circuit 15 allows local base lines Rf1–Rfm in to each receive an alternate-current component of the RF input received at input node Nin.

The bias current supply circuits are configured, as described hereinafter. Since bias current supply circuits 10-1 to 10-n are similarly configured, the configuration of bias current supply circuit 10-1 will be representatively described.

Bias current supply circuit 10-1 includes a transistor Trb1 provided to control an amount of bias current, a collector load resistor Rcb1 coupled between power supply voltage Vcc and a collector terminal of transistor Trb1, and an emitter resistance Reb1 coupled between transistor Trb1 and ground voltage Vss. Bias current supply circuit 10-1 is an emitter-follower bias circuit. Transistor Trb1 has its base region receiving control voltage Vpc for controlling a bias current in level.

In bias current supply circuit 10-1, collector load resistance Rcb1 serves as a bias adjusting portion reducing transistor Trb1's ability to drive current or its current-amplification rate as base current Ib1 increases. The current-amplification rate of transistor Trb1 is a collector current of the transistor divided by a base current of the transistor. As bias current Ib1 increases, with the transistor's collector current Icb1 increasing, collector load resistance Rcb1 experiences an increased voltage drop. Thus, transistor Trb1 has a reduced emitter-collector voltage.

In particular, if a bias condition is set to allow transistor Trb1 to transition, for bias current Ib1 exceeding a predetermined level, from an active-region operation to a saturation-region operation in response to a voltage drop caused by collector load resistance Rcb1, then the transistor Trb1 ability to drive current can be reduced to limit bias current Ib1. In other words, a negative feedback can be given to an increase of bias current Ib1 attributed to thermal unevenness.

Thus a bias current of a block receiving an intensive current attributed to thermal unevenness can be limited to provide a uniform base current for blocks. As such before a specific transistor cell receives an intensive current a specific block can be prevented from receiving an intensive current. Thus, uneven operation can be reduced.

Thus the transistor device can have a steady amplification characteristic and it can also be free from destruction.

Variation of Second Embodiment

Figure 5:
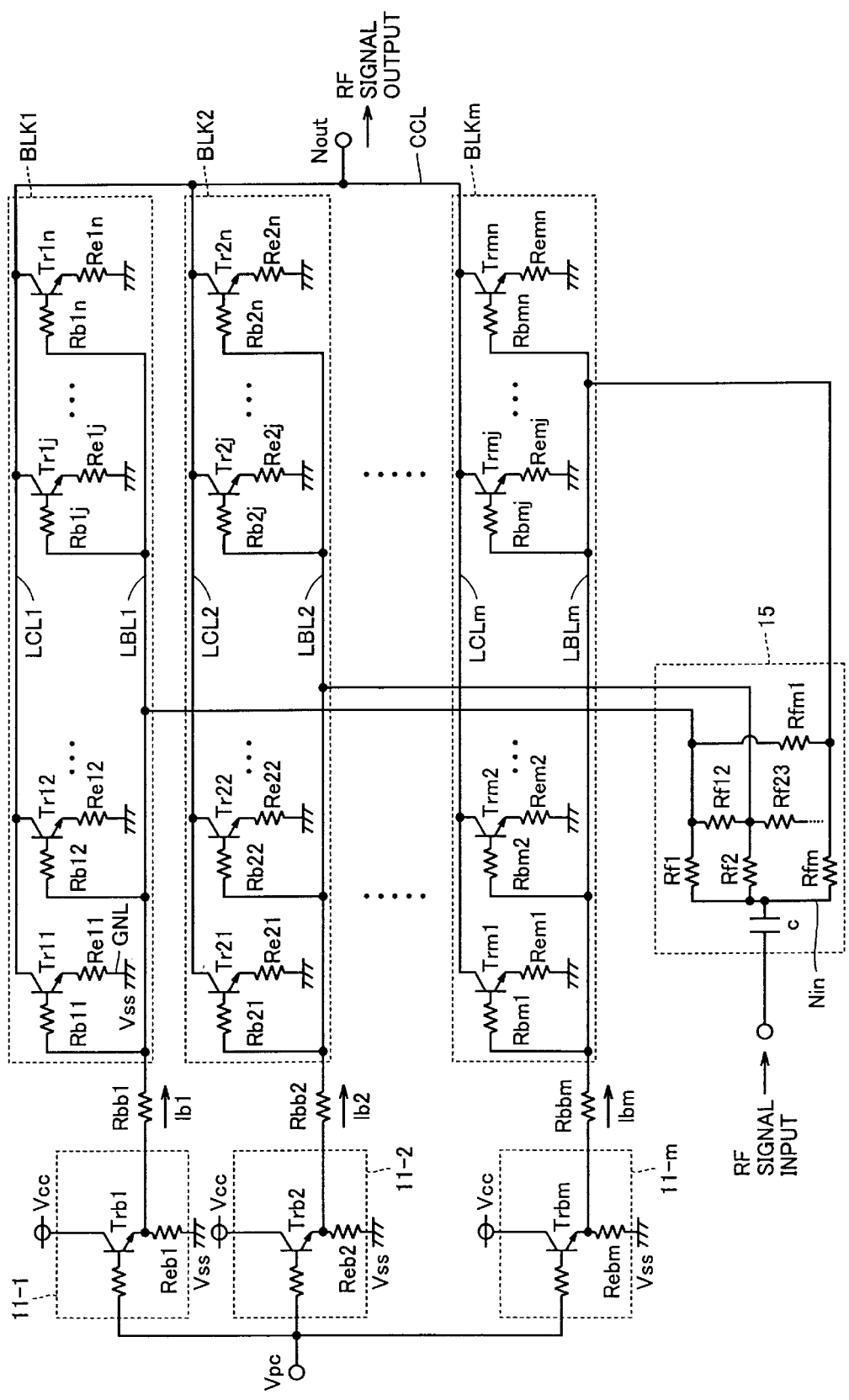
FIG. 5 is a circuit diagram showing a configuration of a bipolar transistor device in an exemplary variation of the second embodiment.

FIG. 5 shows a configuration of a bipolar transistor device as a variation of the second embodiment.

As compared with FIG. 4, FIG. 5 shows the variation of the second embodiment with high impedance transmission lines RFC1–RFCm replaced with resistors Rbb1–Rbbm. Similar to the FIG. 4 high impedance transmission lines RFC1–RFCm, resistors Rbb1–Rbbm attenuate a radio frequency component of bias currents Ib1–Ibm output from bias current supply circuits 10-1 to 10-m. Resistors Rbb1–Rbbm also serve as ballast resistors each arranged for a block, as shown in FIG. 2, for compensating for unevenness in base current between blocks BLK1–BLKm.

Furthermore, bias current supply circuits 10-1 to 10-m are also replaced by bias current supply circuits 11-1 to 11-m formed of a smaller number of components than bias current supply circuits 10-1 to 10-m. Bias current supply circuits 11-1 to 11-m are each different in configuration from bias current supply circuits 10-1 to 10-m in that collector load resistances Rcb1–Rcbm are dispensed with. Collector load resistances Rcb1–Rcbm can be dispensed with because at resistors Rbb1–Rbbm, serving as the ballast resistors for blocks BLK1–BLKm, respectively, bias currents Ib1–Ibm can cause a voltage drop and thus limit a base current for a block receiving an intensive current.

Thus the variation of the second embodiment can provide a configuration having a bias current supply circuit formed of a reduced number of components. The remainder of the configuration and operation will not be described as it is similar to that of the second embodiment shown in FIG. 4.

Thus as well as in the second embodiment a specific transistor cell can be free from an intensive current and the transistor device can thus have a steady amplification characteristic and it can also be free from destruction.

Third Embodiment

Figure 6:
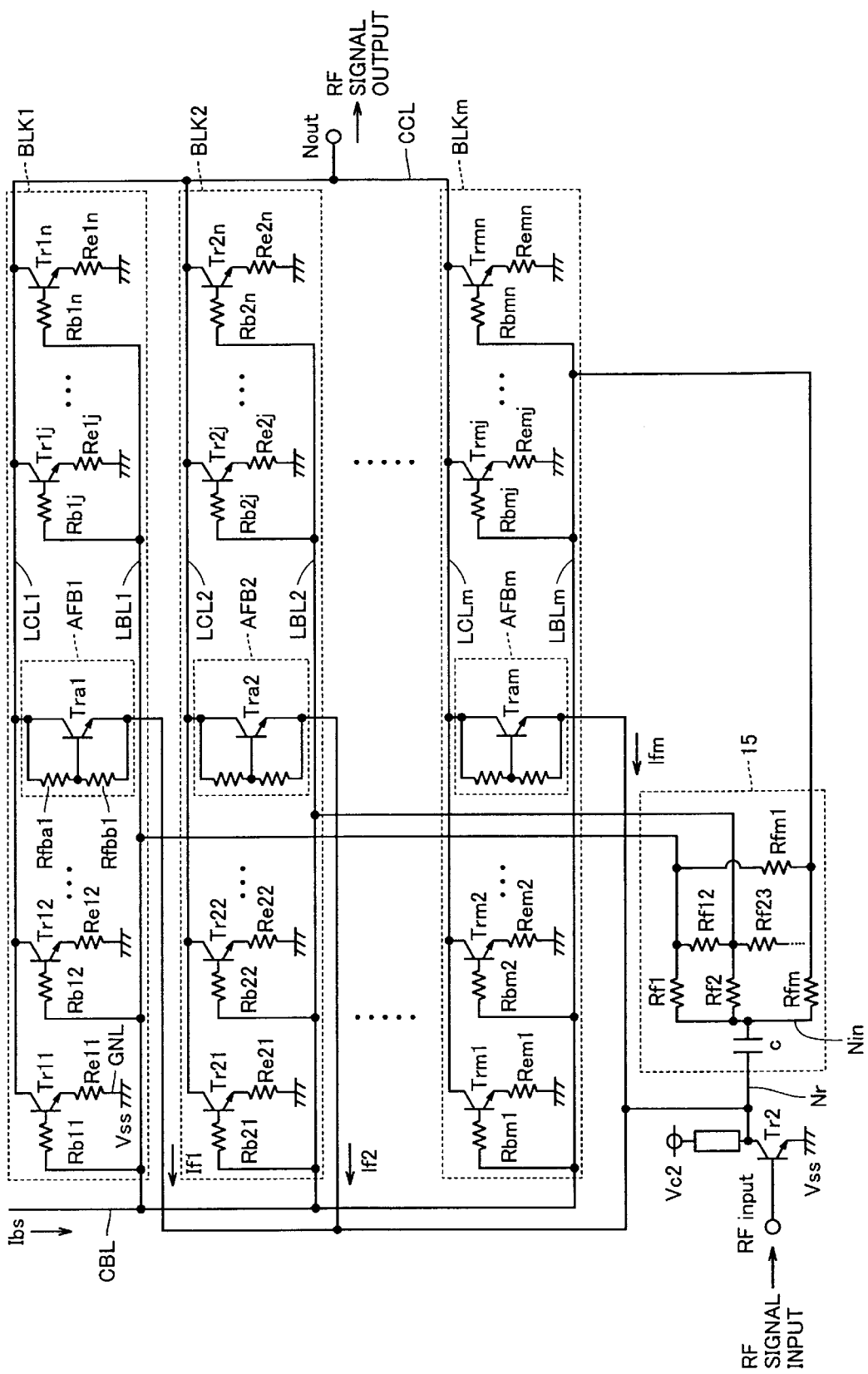
FIG. 6 is a circuit diagram showing a configuration of a bipolar transistor device in a third embodiment of the present invention.

FIG. 6 shows a configuration of a bipolar transistor device in a third embodiment of the present invention.

As shown in FIG. 6, transistor cells Tr11–Trmn arranged in m rows and n columns form blocks BLK1–BLKm each corresponding to a row of transistor cells. Corresponding to blocks BLK1–BLKm, local base lines LBL1–LBLm and local collector lines LCL1–LCLm are arranged, respectively.

Local base lines are coupled with common base line CBL receiving bias current Ibs from common bias circuit 6. Local collector lines LCL1–LCLm are coupled via common collector line CCL with output node Nout outputting an amplified RF signal.

An RF signal input is in turn transmitted via a transistor Tr2 to an intermediate node Nr. Transistor Tr2 has its collector region coupled with a power supply voltage Vc2 via a microwave line. Transistor Tr2 has its base received the RF signal input. Transistor Tr2 has its emitter regions coupled with ground voltage Vss. Input node Nr has a voltage level transmitted to each of local base lines LBL1–LBLm via filter circuit 15 similar to that shown in FIG. 14.

The third embodiment provides a configuration having blocks BLK1–BLKm provided with active feedback circuits AFB1–AFBm, respectively. Active feedback circuits AFB1–AFBm are identical in configuration and active feedback circuit AFB1 will be described representatively. Hereinafter, active feedback circuits AFB1–AFBm will also generally be referred to simply as an active feedback circuit AFB.

Active feedback circuit AFB1 includes a transistor cell Tra1 electrically coupled between local collector line LCL1 and intermediate node Nr, a resistor Rfba1 coupled between local collector line LCL1 and transistor cell Tra1 at the base terminal, and a resistor Rfbb1 coupled between the base terminal of transistor cell Tra1 and input node Nr. The active feedback circuits include transistor cells Tra1–Tram, which will also generally be referred to simply as a transistor cell Tra.

Each active feedback circuit AFB is connected to internal node Nr, which is only required to be a route for interconnection between the collector terminal of transistor Tr2 corresponding to a preceding stage and local base lines LBL1–LBLm each corresponding to a block including the active feedback circuit. As such, intermediate node Nr, connected with any active feedback circuit AFBi of the plurality of active feedback circuits AFB1–AFBm, may be a node with resistors Rf1–Rfm and a capacitor C connected thereto (i.e., a node Nin in FIGS. 5 and 6), wherein i is a natural number from one to m. Alternatively, intermediate node Nr with active feedback circuit AFBi connected thereto may be a corresponding local base line LBLi.

Resistors Rfba1 and Rfbb1 allow transistor cell Tra1 to have a base-emitter voltage Vbe depending on a voltage difference ΔV between local collector line LCL1 and intermediate node Nr, set as represented by the following expression (1):

$$Vbe = \Delta V \times Rfbb1/(Rfba + Rfbb1) \tag{1}$$

As such, transistor cell Tra1 for active feedback turns on under a condition expressed with a collector-emitter voltage Vce corresponding to voltage difference ΔV between local collector line LCL1 and intermediate node Nr, as represented by the following equation (2):

$$Vce > Von \times (1 + Rfba1/Rfbb1) \tag{2}$$

wherein Von represents the ON voltage of the base-emitter voltage of transistor cell Tra1.

The other active feedback circuits AFBs are similarly configured, each arranged between a corresponding local collector line LCL and intermediate node Nr.

If between local collector line LCL and intermediate node Nr there is a voltage exceeding a predetermined level then active feedback circuit AFB electrically couples local collector line LCL and intermediate node Nr together at least in alternate current. If between local collector line LCL and intermediate node Nr there is not a voltage exceeding the predetermined level then active feedback circuit AFB does not electrically couple local collector line LCL and intermediate node Nr together at least in alternate current. Herein, "in alternate current" is used as compared to the fact that in the FIG. 5 active feedback circuit AFB, local collector line LCL and intermediate node Nr are constantly, electrically coupled together via resistors Rfba1 and Rfbb1 in direct current. More specifically for active feedback circuit AFB it is not until transistor cell Tra turns on that local collector line LCL and intermediate node Nr are electrically connected together in alternate current.

A transistor cell receiving an intensive current generates heat and of active feedback circuits AFB1–AFBm a corresponding AFBi has its ON voltage reduced, wherein i is a natural number corresponding to one of one to m. As such, active feedback circuit AFBi in a transistor cell receiving an intensive current and thus increased in temperature quickly turns on if a load varies and a collector voltage is increased. As such in response to the block of interest increasing in temperature all transistor cells can be prevented from being further heated.

Figure 17:
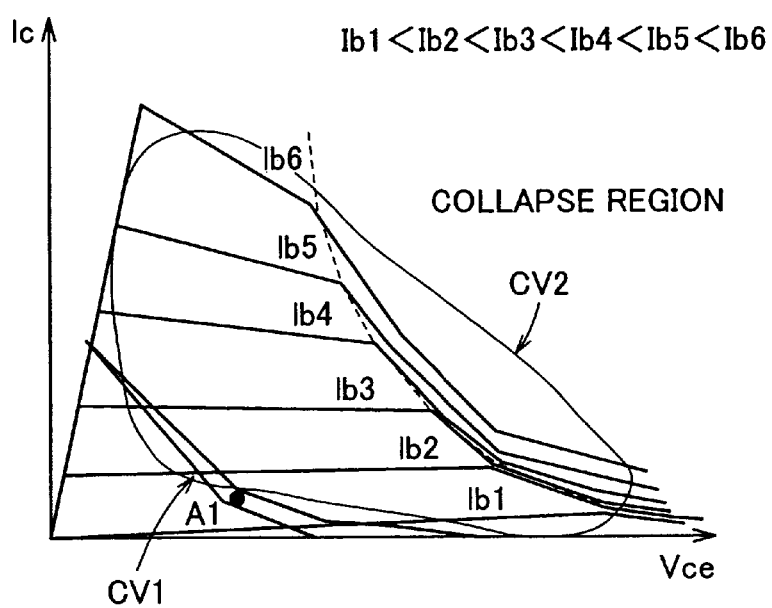
FIG. 17 represents an HBT device's typical Ic–Vce characteristic and load curve in power amplification operation.
Figure 18A:
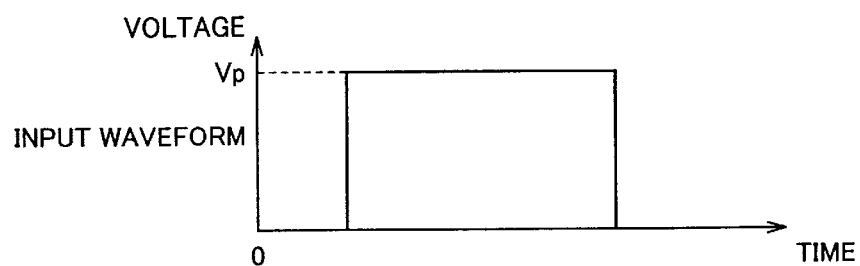
FIGS. 18A–18C represent an amplification operation of a typical power amplifier employed in a mobile telephone.
Figure 18B:
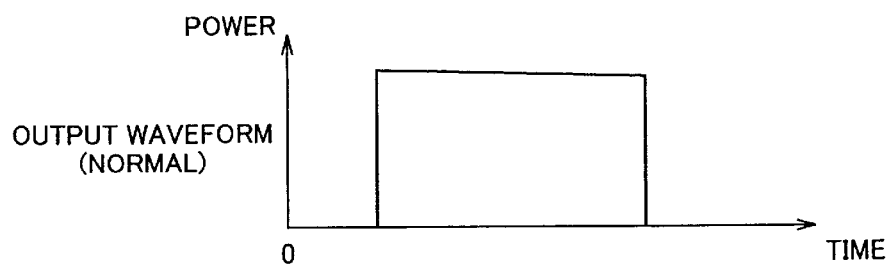
Figure 18C:
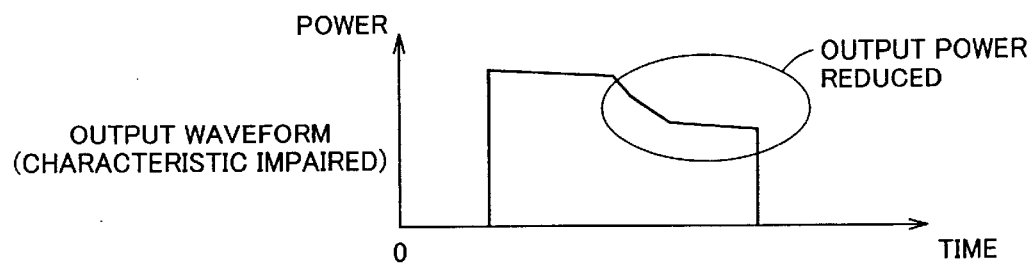

As can be seen from the FIG. 17 graph, a collapse region corresponds to a region with high collector-emitter voltage Vce. As such, by operating an active feedback circuit in the corresponding block receiving an intensive current and thus increased in collector voltage, in such a block the load curve can be prevented from expanding and the transistor cell can thus be prevented from operating in the collapse region.

Thus the transistor device can have a steady amplification characteristic and it can also be free from destruction.

Figure 7A:
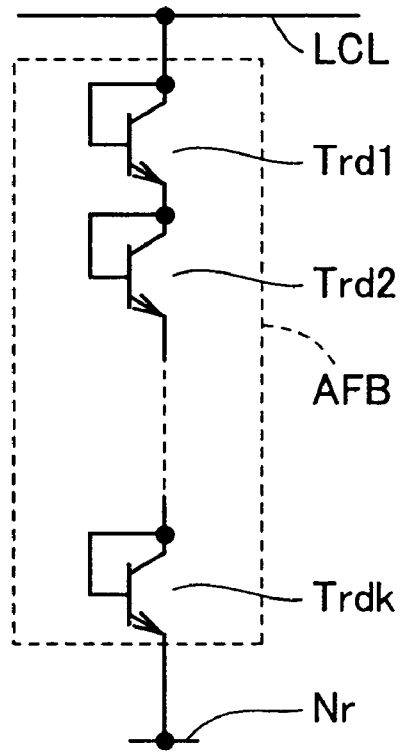
FIGS. 7A and 7B are circuit diagrams each showing another exemplary configuration of an active feedback circuit.
Figure 7B:
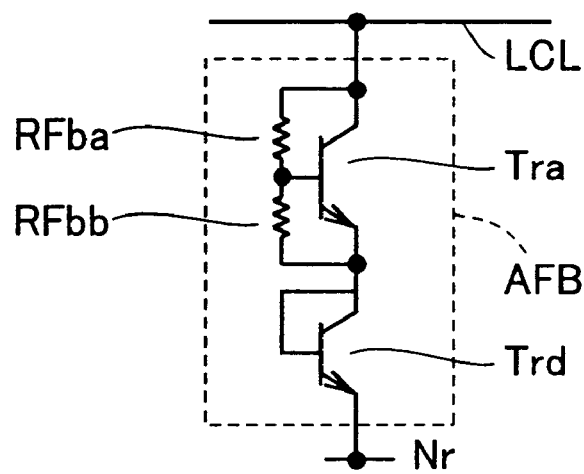

FIGS. 7A and 7B are each a circuit diagram showing the active feedback circuit having another exemplary configuration.

With reference to FIG. 7A, active feedback circuit AFB can also be configured of k transistors Trd1–Trdk coupled in series between local collector line LCL and intermediate node Nr, each in diode connection, wherein k represents a natural number.

If local collector line LCL and intermediate node Nr have therebetween a voltage difference exceeding a predetermined level of voltage then the FIG. 7A active feedback circuit AFB electrically couples local collector line LCL and intermediate node Nr together in alternate current to reduce the voltage on local collector line LCL. If the voltage difference does not exceed the predetermined level of voltage then local collector line LCL and intermediate node Nr are not electrically coupled together in alternate current.

In the FIG. 7A configuration the predetermined level of voltage can be adjusted by the value of k and the value of a characteristic of transistors Trd1–Trdk.

With reference to FIG. 7B, active feedback circuit AFB includes transistor cells Tra and Trd electrically coupled between local collector line LCL and intermediate node Nr. Transistor cell Trd is provided in diode connection. Active feedback circuit AFB also includes resistor Rfba coupled between local collector line LCL1 and transistor cell Tra1 at the base, and resistor Rfbb coupled between the base and emitter of transistor cell Tra1.

The FIG. 7B active feedback circuit AFB has a function similar to that of the FIG. 7A active feedback circuit AFB. More specifically, if local collector line LCL and intermediate node Nr have therebetween a voltage difference exceeding a predetermined level of voltage then the FIG. 7B active feedback circuit AFB turns on to electrically couple local collector line LCL and intermediate node Nr together in alternate current to reduce the voltage on local collector line LCL.

The FIG. 7B active feedback circuit AFB configuration corresponds to the FIG. 6 circuit configuration combined with the transistor cell provided in diode connection that is used in FIG. 7A. As such, active feedback circuit AFB can turn on at the predetermined level of voltage that is adjusted by the ratio of resistors Rfba and Rfbb. Thus a smaller number of transistor cells than in FIG. 7A can be used to configure active feedback circuit AFB.

Figure 8:
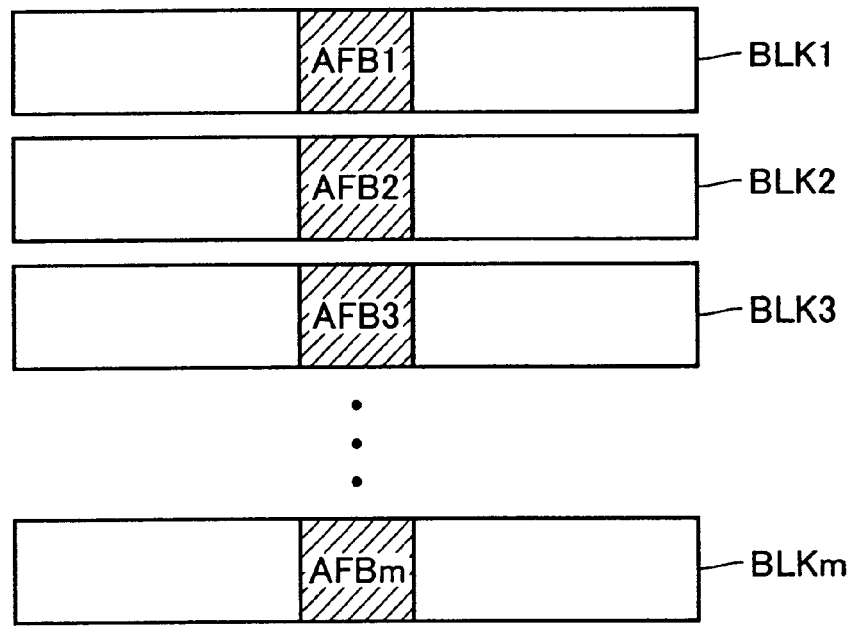
FIG. 8 is a conceptual view showing a first exemplary arrangement of an active feedback circuit AFB.
Figure 9:
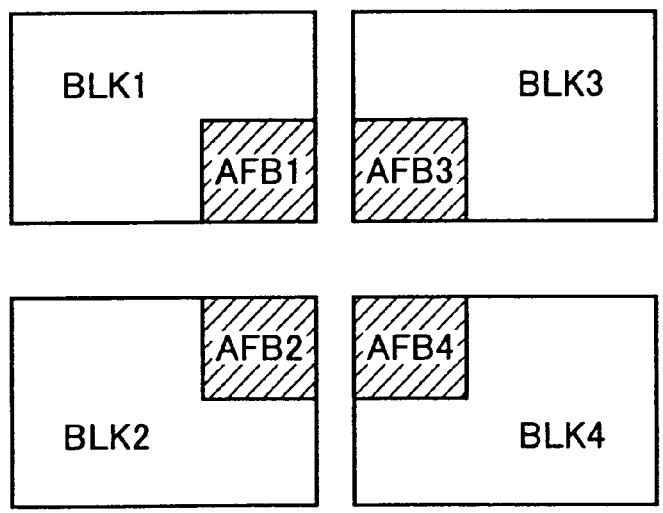
FIG. 9 is a conceptual view showing a second exemplary arrangement of active feedback circuit AFB.

FIGS. 8 and 9 show first and second exemplary arrangements, respectively, of active feedback circuit AFB.

As shown in FIG. 8, blocks BLK1–BLKm are provided with their respective active feedback circuits AFB1–AFBm, each arranged in its respective block at a region susceptible to temperature elevation, i.e., at a center portion.

With the active feedback circuits thus arranged, in a block receiving an intensive current attributed to temperature elevation active feedback circuit AFB can have transistor cells Tra1–Tram having an ON voltage reduced to allow active feedback circuit AFB to more effectively clamp a collector voltage.

As such if a load impedance varies and a load curve varies to pass through a collapse region an active feedback circuit can be rapidly operated to prevent a transistor cell from operating in a collapse region. Consequently, a power amplifier can be configured of a transistor device having a steady amplification characteristic and also prevented from destruction.

FIG. 9, as well as FIG. 3, shows blocks divided with a center portion susceptible to temperature elevation serving as a boundary. Arranging active feedback circuit AFB in each divided block at a region more susceptible to heat elevation, i.e., at a center portion, can achieve an effect similar to that of FIG. 8.

First Variation of Third Embodiment

Figure 10:
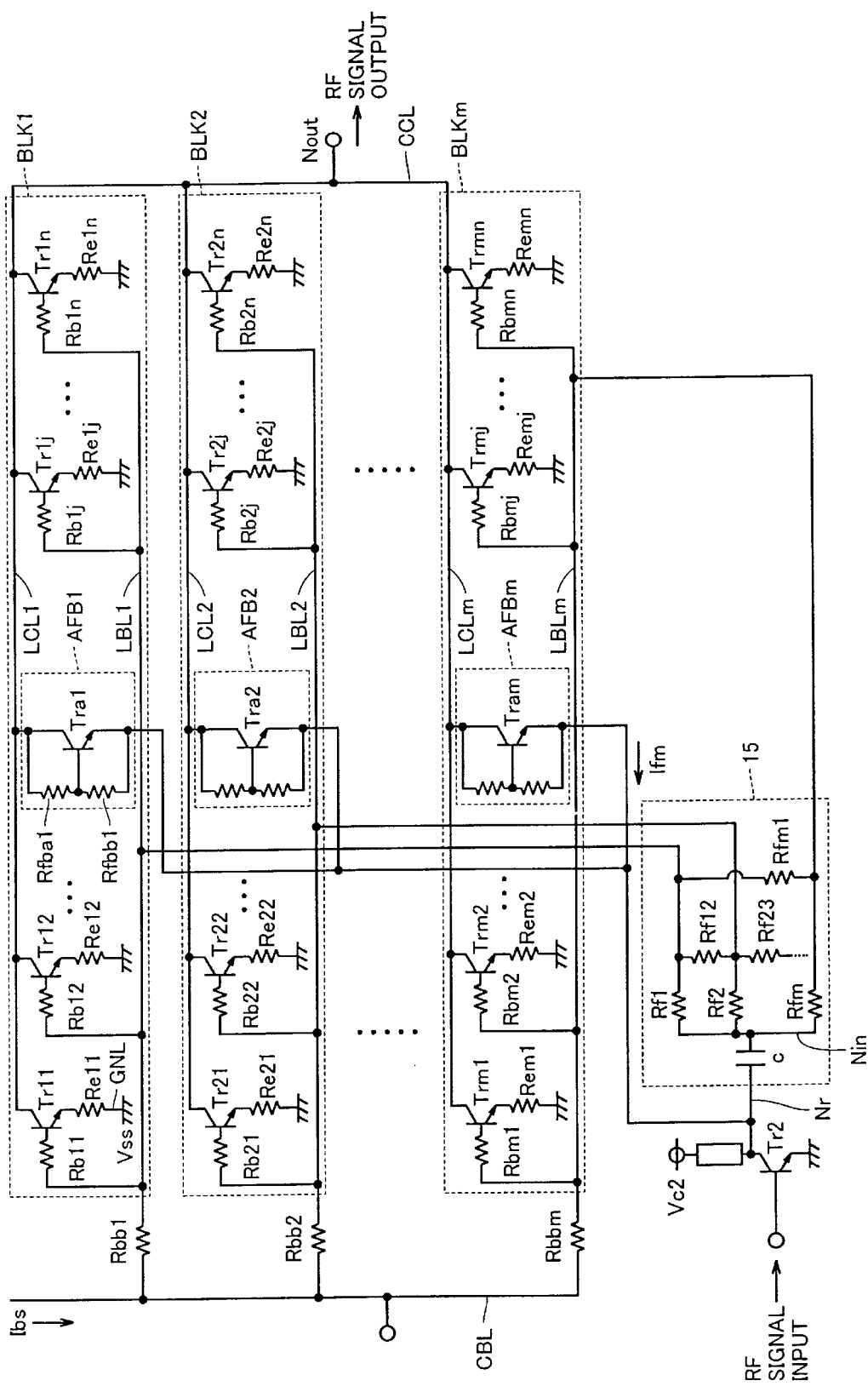
FIG. 10 is a circuit diagram showing a configuration of a bipolar transistor device in a first exemplary variation of the third embodiment.

With reference to FIG. 10, a first variation of the third embodiment is different in that it has the configuration of the third embodiment as shown in FIG. 6 plus ballast resistors Rbb1–Rbbm provided for blocks BLK1–BLKm, respectively. The remainder in configuration will not be described as it is similar to FIG. 6.

Thus, ballast resistors Rbb1–Rbbm and active feedback circuits AFB1–AFBm together can reduce unevenness in base current between blocks. Thus, the both of the effects of the first and third embodiments can be enjoyed to further prevent a specific transistor cell from receiving an intensive current, to provide a transistor device having a further steadier amplification characteristic and further freer from destruction.

Second Variation of Third Embodiment

Figure 11:
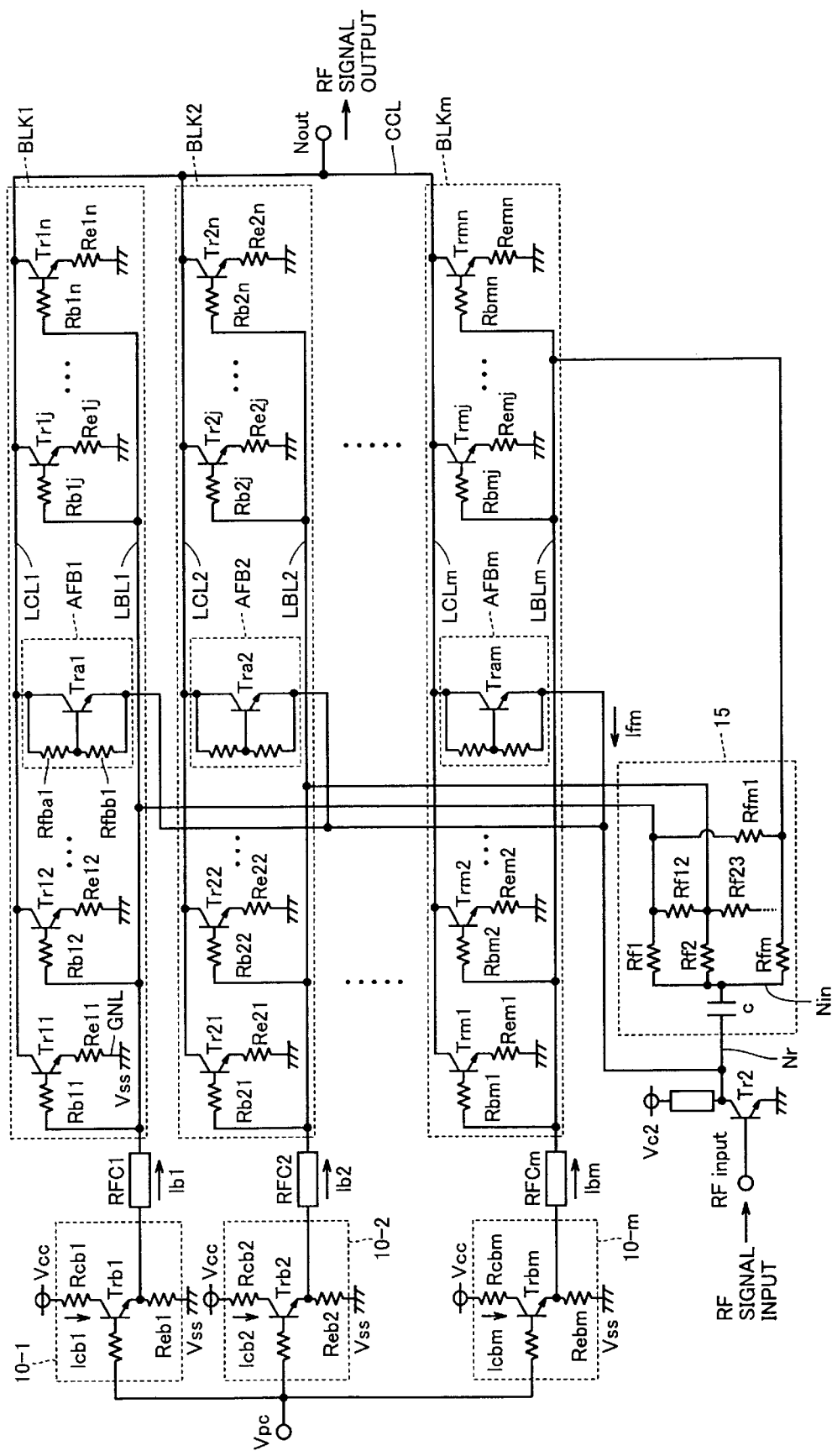
FIG. 11 is a circuit diagram showing a configuration of a bipolar transistor device in a second exemplary variation of the third embodiment.

As shown in FIG. 11, the third embodiment in a second variation provides a bipolar transistor device configured as described in the third embodiment as shown in FIG. 6 with, as shown in FIG. 4, blocks BLK1–BLKm respectively provided with individual bias current supply circuits 10-1 to 10-m and high impedance transmission lines RFC1–RFCm.

Thus, for a block receiving an intensive current, a bias current supply circuit correspondingly giving a feedback to a bias current and an active feedback circuit correspondingly reducing a collector voltage, together can reduce unevenness in base current between blocks. Thus the both of the effects of the second and third embodiments can be enjoyed to provide a transistor device having a further steadier amplification characteristic and further freer of destruction.

Third Variation of Third Embodiment

Figure 12:
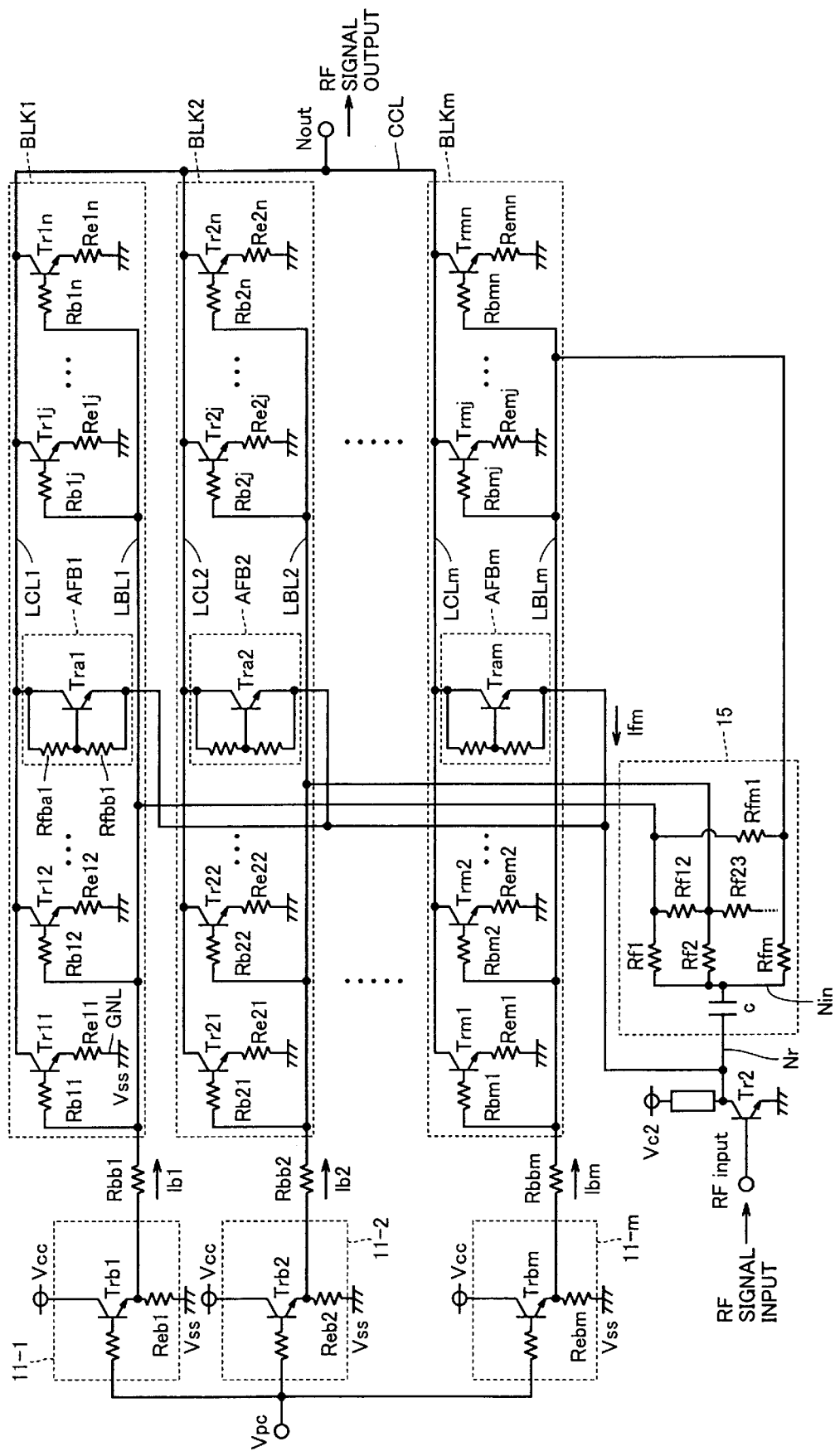
FIG. 12 is a circuit diagram showing a configuration of a transistor device in a third exemplary variation of the third embodiment.

With reference to FIG. 12, the third embodiment in a third variation provides a transistor device configured as described in the third embodiment as shown in FIG. 6 plus bias current supply circuits 11-1 to 11-m and ballast resistors Rbb1–Rbbm provided for blocks BLK1–BLKm, respectively, similarly as shown in the FIG. 5 configuration.

Thus, the effects of the variation of the second embodiment and the third embodiment can be enjoyed to prevent a specific block from receiving an intensive current, to provide a transistor device having a further steadier amplification characteristic and also further freer from destruction.

Fourth Embodiment

Figure 13:
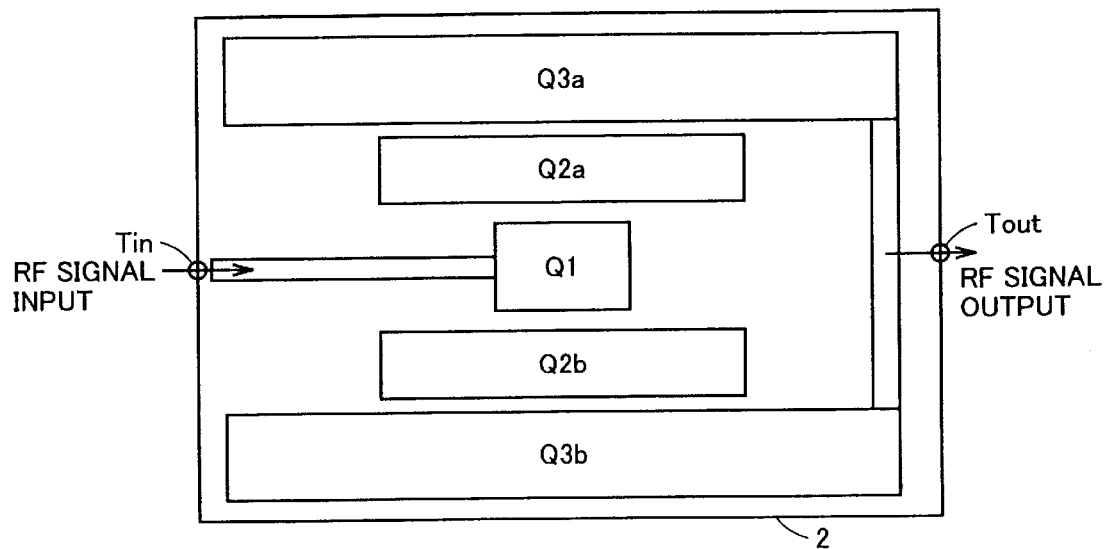
FIG. 13 is a conceptual view for illustrating an arrangement of a transistor device in a fourth embodiment of the present invention.

FIG. 13 is a conceptual view for illustrating an arrangement of a transistor device in a fourth embodiment of the present invention.

FIG. 13 shows an arrangement of transistors Q1–Q3 configuring the FIG. 1 power amplifier 1. Of the plurality of transistors configuring the power amplifier and providing an amplification operation in phases, a transistor of a preceding stage is arranged in a region experiencing a large temperature elevation, i.e., at a location closer to the center of the chip, and a transistor arranged at a succeeding stage is arranged in a region experiencing a small temperature elevation, i.e., at a location closer to a circumference of the chip. Thus the transistors of the plurality of stages are successively arranged, a preceding stage arranged at a region experiencing a large temperature elevation and a succeeding stage arranged at a region experiencing small temperature elevation.

If a plurality of stages are used to amplify power in phases, succeeding transistors amplify larger levels of power and thus produce more heat. As such, such an arrangement as above allows a transistor device amplifying a larger level of power and more readily generating heat to be arranged at a region more readily dissipating heat, i.e., a location closer to a circumference of the chip.

As shown in FIG. 13, the first-stage transistor Q1 is configured of a group of transistor cells arranged on a chip at the exact center region. A second-stage transistor Q2 is configured of a group of transistor cells arranged at regions Q2a and Q2b closer than transistor Q1 to the chip's circumference. The final-stage transistor Q3 is configured of a group of transistor cells arranged at regions Q3a and Q3b located further closer to the chip's circumference.

In general when an HBT formed on a GaAs substrate is heated it accordingly would be reduced in current-amplification rate $\beta$ and hence in output voltage. Arranging a transistor device of a preceding stage closer to the chip's center, which is susceptible to temperature elevation, allows the first- and second-stage transistors Q1 and Q2 to have an output power reduced as temperature increases.

As such, if temperature elevation causes intensive current, the final-stage transistor Q3, amplifying the highest level of power, can receive a controlled, reduced power. As a result, transistor Q3 can be free of operation in a collapse region to provide a steady amplification operation and also allow each transistor cell to be free from destruction.

It should be noted that the FIG. 13 configuration of transistor cells arranged in regions Q1, Q2a, Q2b, Q3a and Q3b is applicable to any configuration in the first embodiment, the second embodiment and the variation thereof, and the third embodiment and the first to third variation thereof.

Furthermore the power amplifier can be formed of transistor devices provided in a number N other than three of stages to amplify power in phases, wherein N represents a natural number. Of the transistor devices arranged in N stages, a transistor device of an initial stage can be arranged on a chip at the center, that of a succeeding stage can be arranged closer to the chip's circumference and a final-stage transistor device can be arranged at the chip's circumference to obtain a similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of transistor cells divided and arranged in a plurality of blocks, for forming a bipolar transistor device;
   a plurality of first lines provided for said plurality of blocks, respectively, and each electrically coupled with a base region of each said transistor cell of a corresponding one of said blocks;
   a plurality of second lines provided for said plurality of blocks, respectively, and each electrically coupled with one of collector and emitter regions of each said transistor cell of a corresponding one of said blocks;
   a reference voltage line electrically coupled with the other of said collector and emitter regions of each of said plurality of transistor cells; and
   a plurality of bias current supply circuits provided for said plurality of blocks, respectively, and each supplying a bias current to a corresponding one of said plurality of first lines, each said bias current supply circuit decreasing an amount of said bias current to be supplied, when said bias current has increased,
   each of said bias current supply circuits including:
      a bias control transistor having a base region receiving a predetermined level of control voltage, electrically coupled between a power supply voltage for generating said bias current and a node supplying said bias current; and
      a bias adjusting portion electrically coupled between said power supply voltage and said bias control transistor, provided to reduce a current drivability of said bias control transistor as said bias current increases.

2. The semiconductor device according to claim 1, further comprising a plurality of radio-frequency attenuation portions provided for said plurality of blocks, respectively, and each electrically coupled between said node corresponding thereto and a corresponding one of said plurality of first lines, to attenuate a radio-frequency component of said bias current.

3. A semiconductor device comprising:
   a plurality of transistor cells divided and arranged in a plurality of blocks, for forming a bipolar transistor device;
   a plurality of first lines provided for said plurality of blocks, respectively, and each electrically coupled with a base region of each said transistor cell of a corresponding one of said blocks;
   a plurality of second lines provided for said plurality of blocks, respectively, and each electrically coupled with one of collector and emitter regions of each said transistor cell of a corresponding one of said blocks;
   a reference voltage line electrically coupled with the other of said collector and emitter regions of each of said plurality of transistor cells;

a plurality of ballast resistors having first ends connected to said plurality of first lines, respectively, and a plurality of bias control transistors provided correspondingly to said plurality of ballast resistors, each having a base region receiving a predetermined level of control voltage and electrically coupled between a power supply voltage for generating a bias current and a second end of a corresponding one of said plurality of ballast resistors.

4. A semiconductor device comprising:

a plurality of transistor cells divided and arranged in a plurality of blocks, for forming a bipolar transistor device;

a plurality of first lines provided for said plurality of blocks, respectively, and each electrically coupled with a base region of each said transistor cell of a corresponding one of said blocks;

a plurality of second lines provided for said plurality of blocks, respectively, and each electrically coupled with one of collector and emitter regions of each said transistor cell of a corresponding one of said blocks;

a reference voltage line electrically coupled with the other of said collector and emitter regions of each of said plurality of transistor cells;

a plurality of bias current supply circuits provided for said plurality of blocks, respectively, and each supplying a bias current to a corresponding one of said plurality of first lines, each said bias current supply circuit decreasing an amount of said bias current to be supplied, when said bias current has increased; and a plurality of feedback circuits provided for said plurality of blocks, respectively, and each electrically coupling a corresponding one of a plurality of second lines and a predetermined internal node together if the corresponding one of said second lines and said internal node have therebetween a voltage difference exceeding a predetermined level of voltage.

* * * * *